US009979403B1

(12) United States Patent
Ding

(10) Patent No.: US 9,979,403 B1
(45) Date of Patent: *May 22, 2018

(54) REFERENCE CLOCK ARCHITECTURE FOR INTEGRATED CIRCUIT DEVICE

(71) Applicant: Altera Corporation, San Jose, CA (US)

(72) Inventor: Weiqi Ding, Fremont, CA (US)

(73) Assignee: ALTERA CORPORATION, San Jose, CA (US)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/295,856

(22) Filed: Oct. 17, 2016

Related U.S. Application Data

(63) Continuation of application No. 14/339,722, filed on Jul. 24, 2014, now Pat. No. 9,479,181.

(51) Int. Cl.
| | |
|---|---|
| *H03L 7/08* | (2006.01) |
| *H03L 7/087* | (2006.01) |
| *H03L 7/197* | (2006.01) |
| *H04L 7/00* | (2006.01) |

(52) U.S. Cl.
CPC ............ *H03L 7/0807* (2013.01); *H03L 7/087* (2013.01); *H03L 7/1974* (2013.01); *H04L 7/0008* (2013.01)

(58) Field of Classification Search
CPC ..... H03L 7/0807; H03L 7/1974; H03L 7/087; H04L 7/0008
See application file for complete search history.

(56) References Cited

U.S. PATENT DOCUMENTS 6,774,740 B1 * 8/2004 Groe .................... H03C 3/0925
332/103
7,295,578 B1 * 11/2007 Lyle ........................ G06F 3/14
348/473

(Continued)

OTHER PUBLICATIONS

Geng, S., et al., "A PLL/DLL Based CDR with ΔΣ Frequency Tracking and Low Algorithmic Jitter Generation," 2013 IEE International Symposium on Circuits and Systems (ISCAS), pp. 1179-82, May 19-23, 2013.

*Primary Examiner* — Kenneth Lam
(74) *Attorney, Agent, or Firm* — Fletcher Yoder P.C.

(57) ABSTRACT

A clocking arrangement for transceivers in an integrated circuit device includes a plurality of fractionally adjustable phase-locked loops. Each respective one of the fractionally adjustable phase-locked loops generates a respective transmit frequency for a respective one of the transceivers. There is a respective clock-data recovery module in a receive portion of each respective one of the transceivers, and each respective clock-data recovery module includes a respective fractionally adjustable frequency-lock loop. There is a reference clock input providing a reference clock for a plurality of the fractionally adjustable phase-locked loops and the fractionally adjustable frequency-lock loops. The reference clock input can be a sole reference clock input providing a reference clock for all of the adjustable phase-locked frequency-lock loops. Alternatively, the reference clock input can include a plurality of separate reference clock inputs, each providing a separate reference clock to a predetermined subset of the adjustable phase-locked or frequency-lock loops.

17 Claims, 5 Drawing Sheets

(56) References Cited

U.S. PATENT DOCUMENTS

| | | | |
|---|---|---|---|
| 7,590,207 B1* | 9/2009 | Shumarayev | H03L 7/087 331/11 |
| 7,742,553 B1 | 6/2010 | Bataineh et al. | |
| 7,743,288 B1* | 6/2010 | Wang | G01R 31/3171 714/703 |
| 8,126,079 B1* | 2/2012 | Tran | H04L 7/033 327/157 |
| 9,479,181 B1* | 10/2016 | Ding | H03L 7/0807 |
| 2005/0036580 A1* | 2/2005 | Rana | H03L 7/1974 375/376 |
| 2006/0008041 A1 | 1/2006 | Kim et al. | |
| 2007/0041485 A1* | 2/2007 | Chang | H03L 7/087 375/376 |
| 2010/0090731 A1* | 4/2010 | Casagrande | H03C 3/0925 327/148 |
| 2010/0232558 A1 | 9/2010 | Terada et al. | |
| 2011/0008053 A1 | 1/2011 | Nguyen | |
| 2011/0188621 A1* | 8/2011 | Asaduzzaman | H03L 7/0814 375/374 |
| 2014/0097878 A1* | 4/2014 | Sindalovsky | H03L 7/087 327/156 |
| 2014/0098843 A1 | 4/2014 | Kong et al. | |
| 2014/0270004 A1 | 9/2014 | Christensen et al. | |
| 2015/0033060 A1* | 1/2015 | Kim | G06F 1/12 713/400 |
| 2015/0073739 A1* | 3/2015 | Khan | G01R 23/02 702/78 |

\* cited by examiner

REFERENCE CLOCK ARCHITECTURE FOR INTEGRATED CIRCUIT DEVICE

CROSS-REFERENCE TO RELATED APPLICATIONS

This application is a continuation of U.S. patent application Ser. No. 14/339,722, filed on Jul. 24, 2014 (U.S. Pat. No. 9,479,181), the disclosure of each of which is incorporated by reference herein in its entirety for all purposes.

BACKGROUND OF THE INVENTION

This invention relates to a reference clock architecture for an integrated circuit device, and particularly for types of integrated circuit devices, such as programmable devices, where a user may specify a clock rate.

Certain types of integrated circuit devices allow users to specify various settings, such as clock rates. In particular, programmable devices, including, for example, programmable logic devices such as field-programmable gate arrays (FPGAs), may allow a user to specify a complete logic configuration, various portions of which may require different clock rates, none of which are known with any certainty at the time of device manufacture. Such devices have been manufactured with circuitry to allow various clock rates to be selected by the user, which may have resulted in overly complex clock networks, including many components that may never be used by a particular user.

For example, such devices may incorporate high-speed serial interfaces to accommodate high-speed (i.e., greater than 1 Gbps) serial I/O standards. Because there are multiple different standards, which may operate at multiple different rates, and because a user may elect to use more than one standard and/or rate, the ability to provide multiple reference clocks may be desirable. Heretofore, this has required the provision of multiple reference clock sources such as phase-locked loops (PLLs) or delay-locked loops (DLLs), with a clock network capable of routing a reference clock signal from any one of those sources to any one of a number of interface circuits.

SUMMARY OF THE INVENTION

The present invention reduces the complexity of reference clocking in integrated circuit devices of a type in which a user can specify one or more clock rates after a device has been manufactured. This is accomplished by providing a finely-adjustable reference clock source in place of multiple separate reference clock sources. That reduces not only the number of reference clock sources, but also the complexity of the reference clock network, because it is no longer necessary to be able to route any of a plurality of different reference clock outputs to any of a plurality of circuits that use those outputs. Rather, a small number of reference clock sources—even a single reference clock source—can generate the needed reference clock outputs, and the reference clock network need only route the outputs of the small number of reference clock sources to the circuits that use those outputs.

One of the types of circuits that uses the output of the reference clock source is clock-data recovery (CDR) circuitry in a serial interface. Certain types of CDR circuitry may use a "dual-loop" architecture in which a frequency-lock loop is used to get close to the target clock, and then a data-lock loop is used to extract the actual clock. In such an architecture, each frequency-lock loop itself includes a reference clock source. Embodiments of the present invention further reduce reference clocking complexity by providing finely-adjustable reference clock sources for CDR frequency-lock loops, thereby reducing the number of different clock sources needed for CDR modules on a device.

According to embodiments of the invention, whether for the reference clock sources for the reference clock network, or the reference clock sources for the CDR modules, the finely-adjustable reference clock sources may be provided using fractional phase-locked loops. In a fractional PLL, the feedback divider/counter, rather than being an adjustable integer counter, is a fractional counter, adjustable in small increments to almost any value that a user may require. For example, the resolution may be as fine as one part-per-million.

Thus, in accordance with the present invention, there is provided a clocking arrangement for transceivers in an integrated circuit device. The clocking arrangement includes a plurality of fractionally adjustable phase-locked loops, each respective one of the fractionally adjustable phase-locked loops being for generating a respective transmit frequency for a respective one of the transceivers. There is a respective clock-data recovery module in a receive portion of each respective one of the transceivers, and each respective clock-data recovery module includes a respective fractionally adjustable frequency-lock loop. There is a reference clock input providing a reference clock for a plurality of the fractionally adjustable phase-locked loops and the fractionally adjustable frequency-lock loops.

The reference clock input can be a sole reference clock input that provides a reference clock for all of the adjustable phase-locked loops and the adjustable frequency-lock loops. In that case, a single reference clock conductor can conduct the reference clock from the single reference clock input to all of the adjustable phase-locked loops and adjustable frequency-lock loops.

Alternatively, the reference clock input can include a plurality of separate reference clock inputs, each of which provides a separate reference clock to a predetermined subset of the adjustable phase-locked loops and the adjustable frequency-lock loops. In that case, there may be a reference clock bus including a respective separate reference clock conductor for conducting each of the separate reference clocks from a respective one of the separate reference clock inputs directly to a respective predetermined subset of the adjustable phase-locked loops and the adjustable frequency-lock loops.

The predetermined subset of the adjustable phase-locked loops and the adjustable frequency-lock loops may include only adjustable phase-locked loops, and may include all or fewer than all of the adjustable phase-locked loops. Alternatively, the predetermined subset of the adjustable phase-locked loops and the adjustable frequency-lock loops may include only adjustable frequency-lock loops, and may include all of the adjustable frequency-lock loops.

An integrated circuit device incorporating such a clocking arrangement, and a method of operating such an integrated circuit device, also are provided.

BRIEF DESCRIPTION OF THE DRAWINGS

Further features and advantages of the invention will be apparent upon consideration of the following detailed description, taken in conjunction with the accompanying drawings, in which like reference characters refer to like parts throughout, and in which.

DETAILED DESCRIPTION OF THE INVENTION

There are many different high-speed serial interface protocols running at different data rates, including, for example and without limitation, PCI Express (PCIe), 10 Gigabit Ethernet (10GE), 10 Gigabit Attachment Unit Interface (XAUI), Serial AT Attachment (SATA), Fibre Channel (FC), and Common Public Radio Interface (CPRI). If an integrated circuit device is to support all, or a large number, of these standards, without knowing in advance which standard a user may want to use, then the device should be able to provide reference clock sources at the data rate of any of these standards. And such reference clocks would be needed both for the transmit portion of any serial interface based on such standard, and for clock-data recovery in the receive portion of such an interface (where, as is frequently the case, the serial communication is asynchronous and no separate clock signal is transmitted).

A user of such a device may choose any of the foregoing protocols, or other protocols, depending on the needs of the user's application. For ease of discussion, embodiments of the invention will be discussed in connection with programmable logic devices (PLDs) such as FPGAs. It should be understood, however, that the invention also may be embodied in other types of devices having user-configurable or user-programmable transceiver interfaces, whether the remainder of the device is fixed or programmable.

Figure 1:
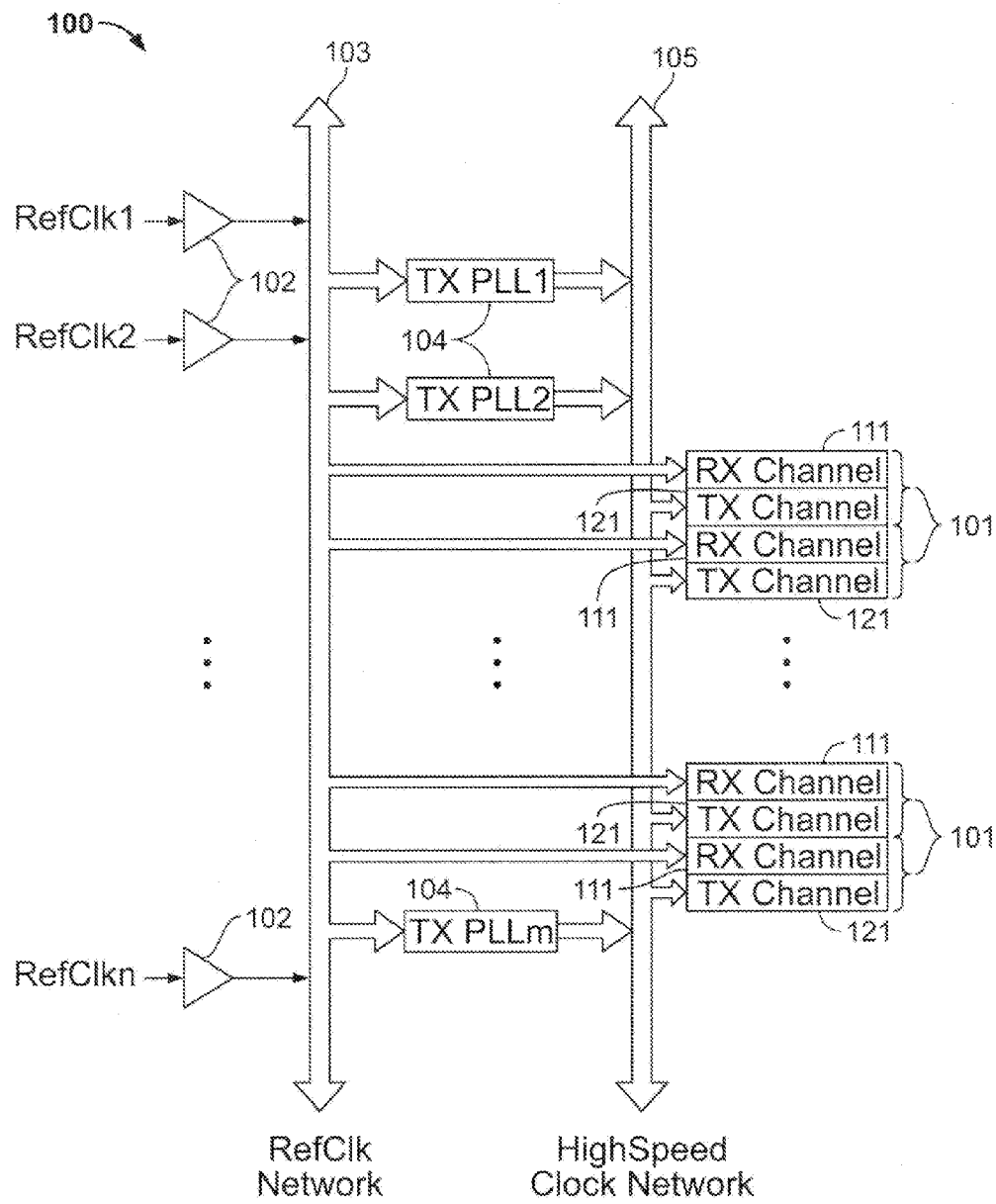
FIG. 1 shows a known configurable transceiver arrangement.

FIG. 1 shows a portion of a known transceiver arrangement 100 that may be provided with a PLD, either on the same die, or on one or more separate dice that are wire-bonded or otherwise connected (e.g., via a bump array) to the PLD die. Transceiver arrangement 100 includes a plurality of transceivers 101, each including a receive (RX) channel 111 and a transmit (TX) channel 121. A plurality of input reference clock buffers 102 (three shown explicitly) allow a user to input to transceiver arrangement 100 whatever reference clocks may be needed for the user's particular design.

Any input clocks that may be applied to reference clock buffers 102 are then applied by reference clock buffers 102 to reference clock network 103. Reference clock network 103 includes sufficient conductors (not shown) to route as many input reference clocks as may be applied to reference clock buffers 102 to any destination that a user may select. Generally, that means that the number of conductors in reference clock network 103 is at least equal to the number of reference clock buffers 102. Moreover, because reference clock network 103 should be able to conduct the input reference clocks to any portion of the device at which a high-speed serial interface may be located, those conductors are likely to be long, and, to prevent signal degradation, they are likely to be relatively wider, and spaced relatively further apart, than most conductors on the device that do not have to convey signals as far. In addition, routing resources to allow selective routing according to a user design also are included in reference clock network 103. It will be appreciated, then, that reference clock network 103 consumes a relatively larger portion of device resources, as well as power, than some other portions of the device.

In particular, each receive channel 111 includes a PLL as part of the frequency-lock loop of its CDR circuitry. Therefore, the relevant input reference clock has to be able to be routed to a corresponding receive channel 111.

Similarly, a plurality of transmit PLLs 104 (three shown explicitly) also are provided, to generate transmit frequencies for transmit channels 121. Again, because each transmit channel 121 may transmit on its own respective frequency, the number of transmit PLLs 104 may be at least as great as the number of transmit channels 121, although embodiments in which multiple transmit channels use the same frequency are also possible, in which case the number of transmit PLLs 104 could be less than the number of transmit channels 121. On the other hand, in order to offer users the required flexibility in choosing a transmit frequency, the number of transmit PLLs 104 could be higher than the number of transmit channels 121 even if re-use were possible.

Further resources are consumed by high-speed clock network 105, which routes the output of each transmit PLL 104 that is in use to the corresponding transmit channel or channels 121. High-speed clock network 105 shares many characteristics of reference clock network 103, including its consumption of resources and power.

Figure 2:
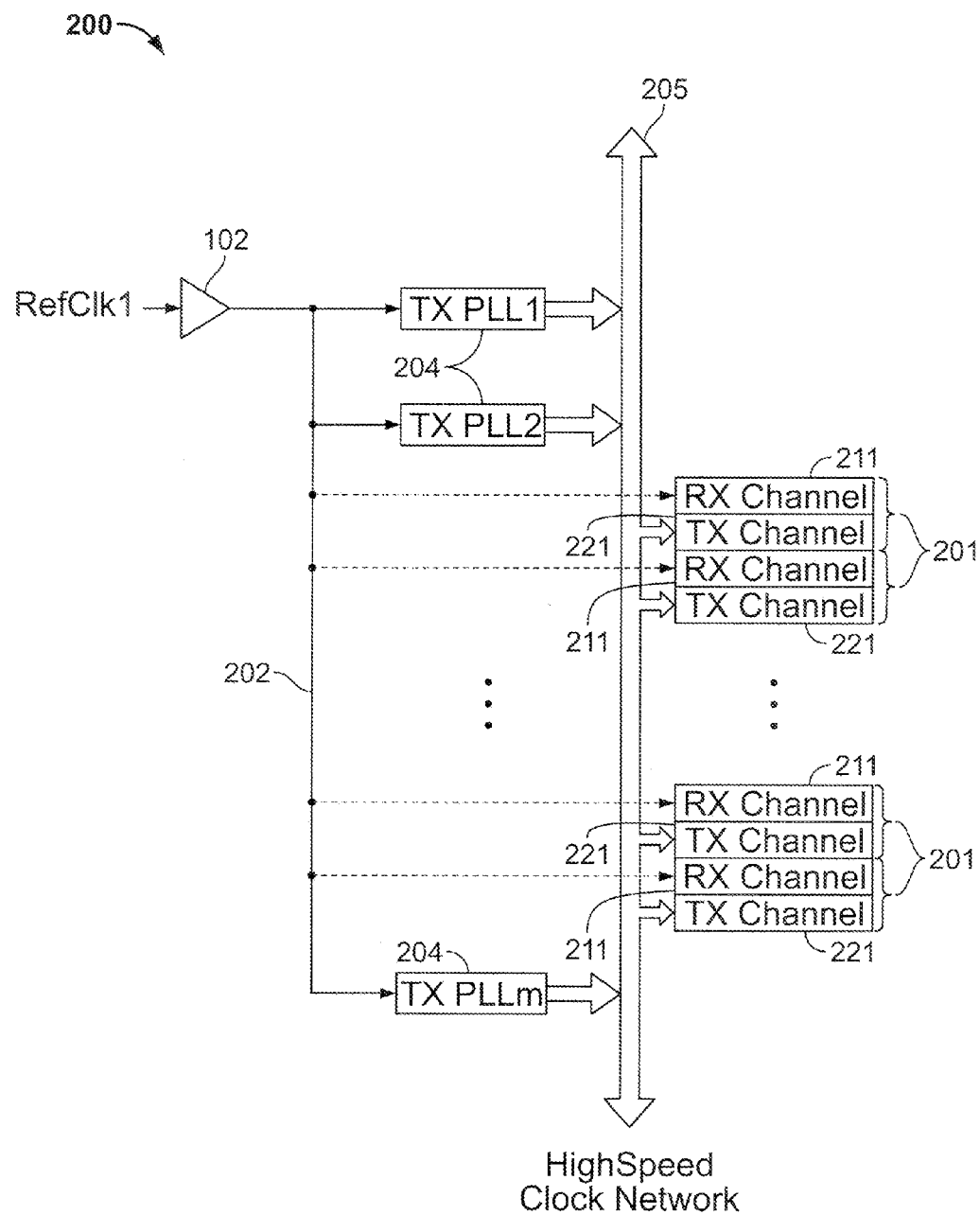
FIG. 2 shows a configurable transceiver arrangement according to embodiments of the present invention.

FIG. 2 shows an implementation 200 of an embodiment of the present invention, illustrating how reference clock network 103 may be eliminated, thereby conserving resources and power. In implementation 200, each transmit PLL 204 is a fractional PLL. That may not reduce the number of transmit PLLs 204 as compared to the number of transmit PLLs 104 in transceiver arrangement 100, because each transmit channel 221 of each transceiver 201 may still need its own frequency. As a result, high-speed clock network 205 similarly is generally not any smaller than high-speed clock network 105 in transceiver arrangement 100, although, because each transmit PLL 204 is a fractional PLL, the number of transmit PLL 204s generally would not need to be greater than the number of transmit channels 221, and could be smaller some amount of frequency re-use were certain to occur.

However, the number of input reference clocks, and therefore the number of input reference clock buffers 102, may be reduced to one, because each of the fractional transmit PLLs 204 can generate its respective frequency from the one input reference clock, which can be conducted to the fractional transmit PLLs 204 by a single-conductor clock bus 202 (or a clock bus with very few conductors, as discussed below). Single-conductor clock bus 202 can also be used to conduct the single input reference clock from single input reference clock buffer 102 to the fractional PLL 301 (FIG. 3) of each receive channel 211 of each transceiver 201.

Figure 3:
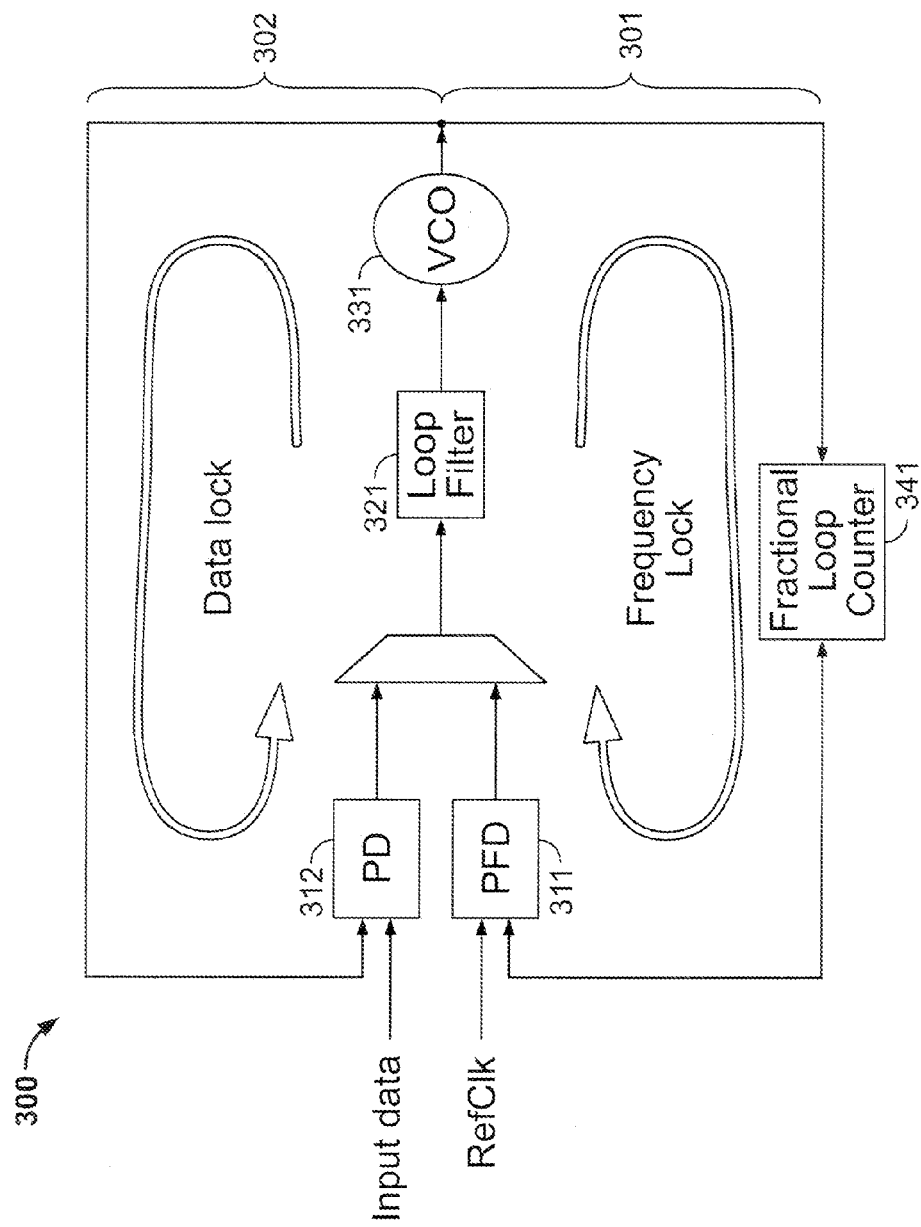
FIG. 3 shows an example of a clock-data recovery module that may be used in the arrangement of FIG. 2.

FIG. 3 shows schematically a CDR module 300 in one of receive channels 211. CDR module 300 includes a frequency-lock loop 301 and a data-lock loop 302.

Frequency-lock loop 301 is used to get close to the target frequency, using phase-frequency detector (PFD) 311, loop filter 321, voltage-controlled oscillator (VCO) 331, and fractional loop counter 341 as a fractional PLL to lock onto the target frequency based on the input of reference clock 201 and the value of fractional loop counter 341.

Once frequency-lock loop 301 gets close enough (as determined, e.g., by a lock-detect circuit (not shown), which may be conventional), data-lock loop 302 takes over, locking onto the recovered frequency using phase detector (PD) 312, loop filter 321 and VCO 331. Although fractional loop counter 341 may introduce jitter because it may operate by dithering between two integer values, that jitter does not affect the output frequency of data-lock loop 302, because fractional loop counter 341 is not used in data-lock loop 302, and the jitter is not consequential during the frequency-lock stage.

However, jitter is of concern in the transmit PLLs 104. Therefore, at least the fractional loop counters (not shown) used in transmit PLLs 104 should meet the jitter specifications of the various serial protocols that may be used. The fractional loop counters can be of analog or digital construction; however, the digital construction consumes less area and may be favored for that reason.

It should be noted that while only a single reference clock input has been shown, connected by a single conductor to the various fractional PLLs on the device, there could be multiple reference clock inputs, each of which is conducted by a respective single conductor to a respective subset of the various fractional PLLs on the device. In such an implementation, the "single" conductor may be a multi-conductor bus, with fixed connections to the target fractional PLLs. For example, there may be one reference clock input for the transmit PLLs and a separate reference clock input for the PLLs in the receiver CDR modules. Alternatively, different reference clock inputs may serve different geographic portions of the device to reduce skew and/or the power required to transmit the reference clock over the entire device.

As can be seen, by using fractional PLLS for both the transmit PLLs 104 and the CDR modules 300, reference clock network 103 can be eliminated, reducing both area and power consumption. Moreover, because a single input reference clock can be used, users are saved the effort and expense of providing multiple input reference clocks.

Figure 4:
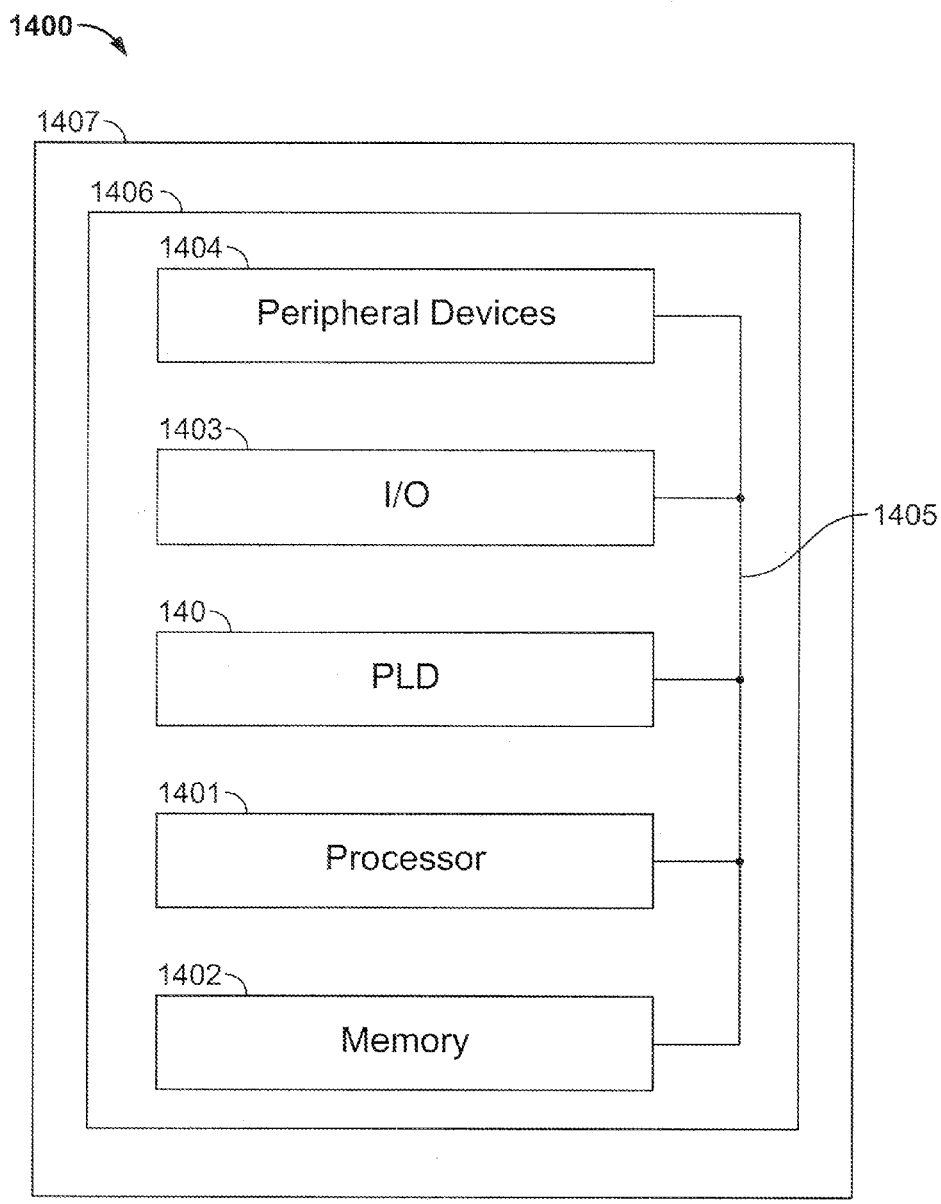
FIG. 4 shows a simplified block diagram of an illustrative system employing a programmable logic device incorporating a configurable transceiver arrangement in accordance with the present invention.

A PLD 140 incorporating interfaces that are clocked according to embodiments of the present invention may be used in many kinds of electronic devices. One possible use is in a data processing system 1400 shown in FIG. 4. Data processing system 1400 may include one or more of the following components: a processor 1421; memory 1422; I/O circuitry 1423; and peripheral devices 1424. These components are coupled together by a system bus 1425 and are populated on a circuit board 1426 which is contained in an end-user system 1427.

System 1420 can be used in a wide variety of applications, such as computer networking, data networking, instrumentation, video processing, digital signal processing, or any other application where the advantage of using programmable or reprogrammable logic is desirable. PLD 140 can be used to perform a variety of different logic functions. For example, PLD 140 can be configured as a processor or controller that works in cooperation with processor 1421. PLD 140 may also be used as an arbiter for arbitrating access to a shared resources in system 1400. In yet another example, PLD 140 can be configured as an interface between processor 1421 and one of the other components in system 1420. It should be noted that system 1420 is only exemplary, and that the true scope and spirit of the invention should be indicated by the following claims.

Various technologies can be used to implement PLDs 140 as described above and incorporating this invention.

Figure 5:
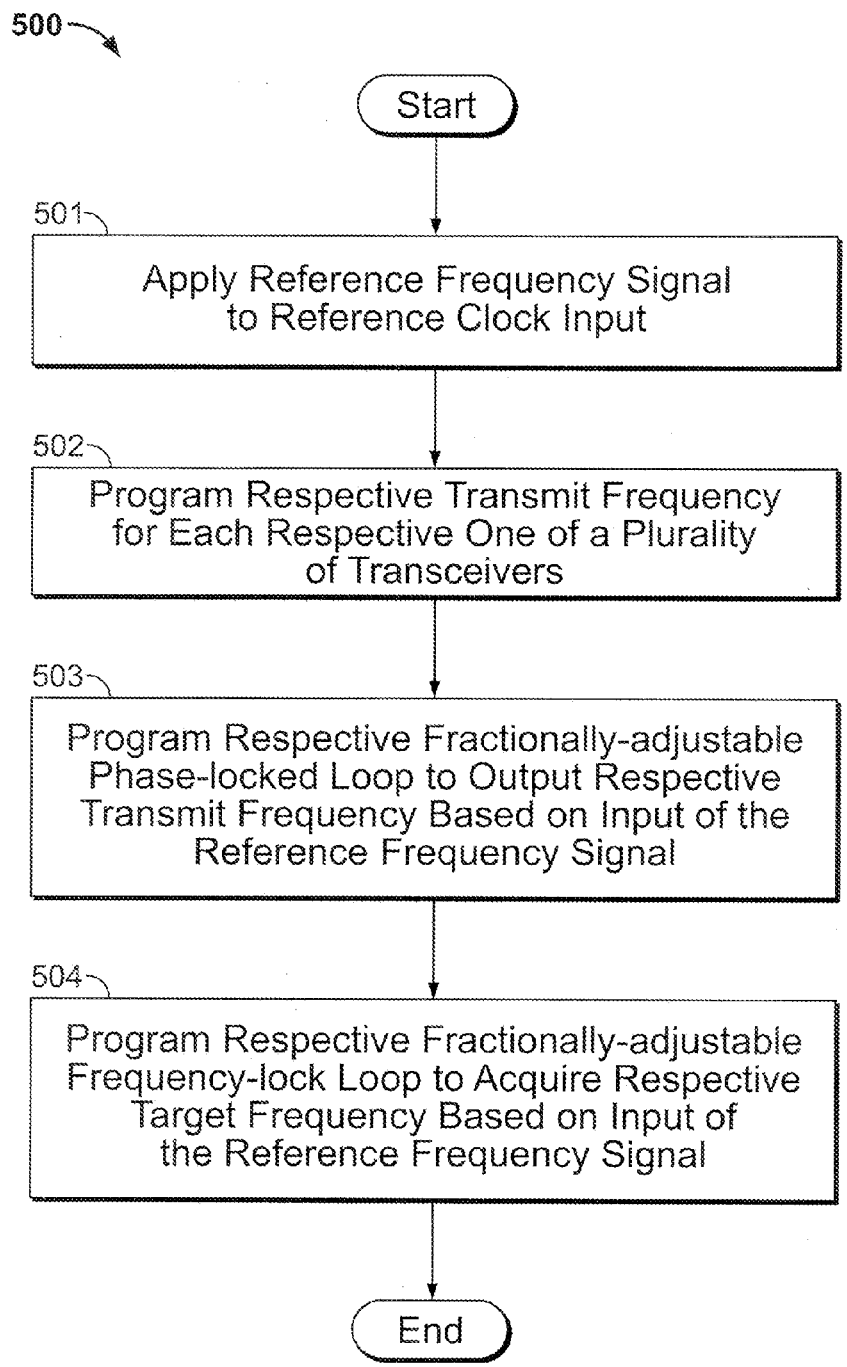
FIG. 5 shows a flow diagram of an embodiment of a method of operating a programmable logic device incorporating a configurable transceiver arrangement in accordance with the present invention.

FIG. 5 is a flow diagram of one possible embodiment 500 of a method according to the present invention for operating an integrated circuit device having a clock architecture as described above.

Method 500 begins at 501 where a reference frequency signal is applied to a reference clock input. At 502, a respective transmit frequency for each respective one of a plurality of transceivers is programmed, and at 503, respective fractionally-adjustable phase-locked loops are programmed to output respective transmit frequencies based on input of the reference frequency signal. At 504, respective fractionally adjustable frequency-lock loops are programmed to acquire respective target received frequencies based on input of the reference frequency signal.

At 501, application of a reference frequency signal to the reference clock input could include applying each of a plurality of separate reference clock inputs to one of a plurality of predetermined subsets of the adjustable phase-locked loops and the adjustable frequency-lock loops. One of the plurality of predetermined subsets of adjustable phase-locked loops and adjustable frequency-lock loops could include only adjustable phase-locked loops, and could include all of the adjustable phase-locked loops on the device. Similarly, one of the plurality of predetermined subsets of adjustable phase-locked loops and adjustable frequency-lock loops could include only adjustable frequency-lock loops, and could include all of the adjustable frequency-lock loops on the device.

It will be understood that the foregoing is only illustrative of the principles of the invention, and that various modifications can be made by those skilled in the art without departing from the scope and spirit of the invention, and the present invention is limited only by the claims that follow.

What is claimed is:

1. A method to operate an integrated circuit comprising:
providing a reference clock to a plurality of transceivers of the integrated circuit;
programming a fractionally-adjustable phase-locked loop (PLL) of a first transceiver of the plurality of transceivers based on a first target data rate of the first transceiver and a clock rate of the reference clock;
providing an input data signal to the first transceiver, wherein the input data signal comprises an input data rate;
in a frequency lock mode, producing an output clock signal at the first target data rate of the first transceiver using the reference clock input and the fractionally-adjustable PLL; and
in a data lock mode, producing the output clock signal at the input data rate based on the input data signal.

2. The method of claim 1, wherein the integrated circuit comprises a clock-and-data recovery module that comprises the first transceiver.

3. The method of claim 1, programming a fractionally-adjustable PLL comprises adjusting a value of a fractional loop counter of the first transceiver.

4. The method of claim 1, wherein producing the output clock signal corresponding to the first target data rate comprises:
measuring a phase difference between the output clock signal and the reference clock input using a phase-frequency detector of the first transceiver; and
adjusting the PLL clock signal based on the phase difference using a voltage-controlled oscillator.

5. The method of claim 1, wherein producing the output clock signal at the input data rate based on the input data signal comprises measuring a phase difference between the output clock signal and the input data signal using phase detector of the first transceiver.

6. The method of claim 1, comprising:
in the frequency lock mode, determining that a first rate of the output clock signal approximates the first target data rate using a lock-detect circuit;
switching from the frequency lock mode to the lock detect mode based on the determination that the first rate approximates the first data rate; and
in the data lock mode, adjusting the frequency of the output clock signal from the first target data rate to the input data rate.

7. The method of claim 6, wherein switching from the frequency lock mode to the lock detect mode comprises adjusting a multiplexor of the first transceiver.

8. The method of claim 1, wherein the target data rate corresponds to 10 Gbps.

9. A transceiver configured to receive a first input signal, the transceiver comprising:
a phase-locked loop that comprises:
a phase-frequency detector that receives a reference clock signal from a clock signal generator at a fixed clock frequency and a second clock signal from a fractional loop counter configured to receive an output clock signal, wherein the fractional loop counter is programmed to set a frequency of the output clock signal to a first target frequency based on a difference between the fixed clock frequency and a data frequency of the first input signal;
a phase detector that receives the input data signal and the output clock signal, and is configured to set the frequency of the output clock signal to the data frequency of the first input signal; and
a multiplexor coupled to the phase-frequency detector and to the phase detector;
wherein the clock signal generator is configured to provide the clock signal at the fixed clock frequency to a second transceiver configured to receive a second input signal that comprises a second data frequency different from the first data frequency.

10. The transceiver of claim 9, comprising a fractional loop counter coupled to the voltage-controlled oscillator that produces the output clock signal to the phase-frequency detector.

11. The transceiver of claim 9, comprising a lock-detect circuit that produces a lock-detect signal based on a difference between the reference clock signal and the second clock signal.

12. The transceiver of claim 11, wherein the multiplexor selects between the phase-frequency detector and the phase detector based on the lock-detect signal.

13. The transceiver of claim 9, comprising a voltage-controlled oscillator coupled to the multiplexor that provides the output clock signal to the phase detector.

14. The transceiver of claim 9, comprising circuitry that recovers serial data based on the output clock signal and the input data signal.

15. The transceiver of claim 9, comprising circuitry that produces serial data based on the output clock signal.

16. An integrated circuit comprising:
a plurality of transceivers, each transceiver comprising a phase-locked loop (PLL) circuitry configured to receive a reference clock signal at a fixed clock frequency from a clock generator, wherein each transceiver is configured to receive a respective input data signal at a respective data frequency, and wherein each respective PLL circuitry comprises:
a respective frequency lock loop comprising:
a fractional loop counter coupled to a voltage-controlled oscillator, wherein the fractional loop counter is programmed based on the clock frequency and on a respective target frequency that approximates the respective data frequency; and
a phase-frequency detector that receives the reference clock signal and is coupled to the fractional loop counter;
a respective data lock loop comprising a phase detector that receives the respective input data signal and is coupled to the voltage-controlled oscillator; and
a respective multiplexor that selects between the respective frequency lock loop and the respective fractional loop counter.

17. The integrated circuitry of claim 16, wherein each respective PLL circuitry comprises a lock-detect circuit that adjusts the selection of the multiplexor based on a difference between the reference clock signal and a respective output data signal of the respective fractional loop counter.

* * * * *